United States Patent

Shelton et al.

Patent Number: 6,117,779
Date of Patent: Sep. 12, 2000

[54] ENDPOINT DETECTION METHOD AND APPARATUS WHICH UTILIZE A CHELATING AGENT TO DETECT A POLISHING ENDPOINT

[75] Inventors: Gail D. Shelton; Gayle W. Miller, both of Colorado Springs, Colo.

[73] Assignee: LSI Logic Corporation, Milpitas, Calif.

[21] Appl. No.: 09/212,503

[22] Filed: Dec. 15, 1998

[51] Int. Cl.⁷ .................. H01L 21/461; H01L 21/302
[52] U.S. Cl. .................................... 438/692; 438/693
[58] Field of Search .................. 438/691, 692, 438/693, 4, 14; 215/89, 88, 38, 39

[56] References Cited

U.S. PATENT DOCUMENTS

| Number | Date | Name | Ref |
|---|---|---|---|
| 3,734,620 | 5/1973 | Cade | 356/73 |
| 3,748,014 | 7/1973 | Beiser | 350/6 |
| 4,312,732 | 1/1982 | Degenkolb et al. | 204/192 |
| 4,374,915 | 2/1983 | Ahlquist et al. . | |
| 4,632,724 | 12/1986 | Chesebro et al. . | |
| 4,689,491 | 8/1987 | Lindow et al. | 250/572 |
| 4,793,895 | 12/1988 | Kaanta et al. | 156/627 |
| 5,036,015 | 7/1991 | Sandhu et al. | 437/8 |
| 5,069,002 | 12/1991 | Sandhu et al. | 451/1 |
| 5,081,421 | 1/1992 | Miller et al. | 324/671 |
| 5,151,584 | 9/1992 | Ebbing et al. | 250/201.4 |
| 5,169,491 | 12/1992 | Doan | 156/636 |
| 5,196,353 | 3/1993 | Sandhu et al. | 437/8 |
| 5,222,329 | 6/1993 | Yu | 51/165.77 |
| 5,240,552 | 8/1993 | Yu et al. | 156/636 |
| 5,245,790 | 9/1993 | Jerbic . | |
| 5,245,794 | 9/1993 | Salugsugan | 51/165.74 |
| 5,258,093 | 11/1993 | Maniar . | |
| 5,265,378 | 11/1993 | Rostoker | 51/165.75 |
| 5,272,115 | 12/1993 | Sato | 437/228 |
| 5,308,438 | 5/1994 | Cote et al. | 216/88 |
| 5,310,455 | 5/1994 | Pasch et al. . | |
| 5,321,304 | 6/1994 | Rostoker . | |
| 5,337,015 | 8/1994 | Lustig et al. | 324/671 |
| 5,362,669 | 11/1994 | Boyd et al. . | |
| 5,385,866 | 1/1995 | Bartush . | |
| 5,389,194 | 2/1995 | Rostoker et al. . | |
| 5,399,234 | 3/1995 | Yu et al. | 156/636 |
| 5,403,228 | 4/1995 | Pasch . | |
| 5,405,806 | 4/1995 | Pfiester et al. | 437/200 |
| 5,439,551 | 8/1995 | Meikle et al. | 156/626.1 |
| 5,449,314 | 9/1995 | Meikle et al. . | |
| 5,483,568 | 1/1996 | Yano et al. | 378/44 |
| 5,492,594 | 2/1996 | Burke et al. | 216/86 |
| 5,516,400 | 5/1996 | Pasch et al. . | |
| 5,531,861 | 7/1996 | Yu et al. | 156/636.1 |
| 5,559,428 | 9/1996 | Li et al. | 324/71.5 |
| 5,561,541 | 10/1996 | Sharp et al. | 359/66 |
| 5,595,526 | 1/1997 | Yau et al. | 451/8 |
| 5,597,442 | 1/1997 | Chen et al. | 156/626.1 |
| 5,597,590 | 1/1997 | Tanimoto et al. . | |
| 5,607,341 | 3/1997 | Leach | 451/41 |
| 5,609,511 | 3/1997 | Moriyama et al. | 451/5 |
| 5,614,446 | 3/1997 | Ramaswami et al. . | |
| 5,624,304 | 4/1997 | Pasch et al. . | |
| 5,626,715 | 5/1997 | Rostoker . | |
| 5,627,110 | 5/1997 | Lee et al. . | |
| 5,637,185 | 6/1997 | Murarka et al. | 438/5 |
| 5,639,388 | 6/1997 | Kimura et al. | 216/84 |
| 5,643,046 | 7/1997 | Katakabe et al. | 451/6 |

(List continued on next page.)

*Primary Examiner*—Benjamin L. Utech
*Assistant Examiner*—Duy-Vu Deo

[57] ABSTRACT

A method of planarizing a semiconductor wafer having a polishing endpoint layer that includes a ligand is disclosed. One step of the method includes polishing a first side of the wafer in order to remove the ligand from the wafer. Another step of the method includes determining that a chelating agent has bound the ligand due to the polishing step removing the ligand of the polishing endpoint layer. The method also includes the step of terminating the polishing step in response to determining that the chelating agent has bound the ligand. A polishing system is also disclosed which detects a polishing endpoint based upon a chelating agent binding a ligand of a polishing endpoint layer of a semiconductor device.

13 Claims, 3 Drawing Sheets

U.S. PATENT DOCUMENTS

| | | | |
|---|---|---|---|
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan . | |
| 5,647,952 | 7/1997 | Chen | 156/636.1 |
| 5,656,229 | 8/1997 | Tanimoto et al. . | |
| 5,658,183 | 8/1997 | Sandhu et al. | 451/5 |
| 5,660,672 | 8/1997 | Li et al. | 156/345 |
| 5,663,101 | 9/1997 | Cronin . | |
| 5,663,797 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon . | |
| 5,667,629 | 9/1997 | Pan et al. | 438/13 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 | 10/1997 | Jang et al. | 437/195 |
| 5,681,215 | 10/1997 | Sherwood | 568/215 |
| 5,691,253 | 11/1997 | Kobayashi . | |
| 5,695,660 | 12/1997 | Litvak | 216/85 |
| 5,700,180 | 12/1997 | Sandhu et al. | 451/5 |
| 5,702,292 | 12/1997 | Brunelli et al. . | |
| 5,704,987 | 1/1998 | Huynh et al. . | |
| 5,705,320 | 1/1998 | Hsu et al. . | |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. . | |
| 5,720,845 | 2/1998 | Liu . | |
| 5,722,875 | 3/1998 | Iwashita et al. | 451/8 |
| 5,722,877 | 3/1998 | Meyer et al. . | |
| 5,725,417 | 3/1998 | Robinson . | |
| 5,736,462 | 4/1998 | Takahashi et al. . | |
| 5,738,567 | 4/1998 | Manzonie et al. . | |
| 5,741,171 | 4/1998 | Sarfaty et al. | 451/6 |
| 5,747,380 | 5/1998 | Yu et al. . | |
| 5,755,614 | 5/1998 | Adams et al. . | |
| 5,762,536 | 6/1998 | Pant et al. . | |
| 5,762,537 | 6/1998 | Sandhu et al. . | |
| 5,777,739 | 7/1998 | Sandhu et al. | 356/357 |
| 5,795,495 | 8/1998 | Meikle . | |
| 5,834,375 | 11/1998 | Chen | 438/692 |
| 5,836,805 | 11/1998 | Obeng | 451/36 |
| 5,861,055 | 1/1999 | Allman et al. . | |
| 5,865,666 | 2/1999 | Nagahara . | |
| 5,868,608 | 2/1999 | Allman et al. . | |
| 5,882,244 | 3/1999 | Hiyama et al. . | |
| 5,882,251 | 3/1999 | Berman et al. . | |
| 5,888,120 | 3/1999 | Doran . | |
| 5,893,756 | 4/1999 | Berman et al. . | |
| 5,916,819 | 6/1999 | Skrovan et al. | 438/692 |
| 5,931,719 | 8/1999 | Nagahara et al. . | |
| 5,948,697 | 9/1999 | Hata . | |
| 5,957,757 | 9/1999 | Berman . | |

ENDPOINT DETECTION METHOD AND APPARATUS WHICH UTILIZE A CHELATING AGENT TO DETECT A POLISHING ENDPOINT

BACKGROUND OF THE INVENTION

The present invention relates generally to an endpoint detection method and apparatus, and more particularly to a method and apparatus that utilize a chelating agent to detect a polishing endpoint of a semiconductor wafer.

Semiconductor integrated circuits are typically fabricated by a layering process in which several layers of material are fabricated (i) on or in a surface of a wafer, or (ii) on a surface of a previous layer. This fabrication process very often requires layers to be fabricated upon a smooth, planar surface of a previous layer. However, the surface topography of layers may be highly uneven due to (i) areas which are higher than the remainder of the surface or (ii) an uneven topography of an underlying layer. As a result, a layer may need to be polished so as to present a smooth planar surface for the next processing step, such as formation of a conductor layer or pattern on the surface of another layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate (i) higher removal rates, and (ii) selective removal of materials fabricated upon the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may result in a significant financial loss. Underpolishing (removing too little) of a conductive layer on the other hand leads to failure in isolating circuits and results in electrical shorts, which leads to rework (redoing the CMP process) which raises the cost of production. Thus, a precise endpoint detection technique is needed.

A typical method employed for determining endpoint in polishing systems is to measure the amount of time needed to planarize a first wafer, and then to run the remaining wafers for similar times. In practice this method is extremely time consuming, since operators must inspect each wafer after polishing. The wafers must be inspected because the removal rate may vary during the polishing of an individual wafer, thus making it extremely difficult to precisely control the polishing process.

Another method employed for determining the endpoint in polishing systems is to (i) form a polishing endpoint layer in the semiconductor device, and (ii) polish the semiconductor device down to the polishing endpoint layer. To this end, polishing systems detect when the polishing process reaches the polishing endpoint layer and terminate the polishing process in response to reaching the polishing endpoint layer. Various techniques have been used to detect when the polishing process reaches the polishing endpoint layer. For example, U.S. Pat. No. 5,668,063 to Fry et al. polishes a semiconductor device down to a tracer layer of detectable material. The polishing system of Fry determines that the tracer layer has been reached when a chemical element detector detects materials such as boron or phosphorous of the tracer layer have been removed by the polishing process.

In order to base endpoint detection upon directly detecting material of the tracer layer, the chemical element detector needs to accurately detect rather small amounts of the tracer layer material, or the polishing system needs to remove more of the tracer layer material in order to provide the chemical element detector with enough material for accurate detection. The above is also true if the material of the tracer layer is consumed as a reagent of a chemical reaction to be detected by the detector. In this case, the detector would need to be able to detect the effect of a small reaction, or the polishing system would need to remove more of the tracer layer in order to provide enough tracer material for a substantial reaction to occur.

Detectors capable of detecting small amounts of the tracer layer or detecting the effect of a small chemical reaction are more expensive than detectors capable of detecting larger amounts of the tracer layer or detecting the effect of a larger chemical reaction. Furthermore, the additional removal of the tracer layer in order to provide more tracer layer material for direct detection increases the risk of overpolishing especially when the topography of the tracer layer is highly uneven.

Thus, a continuing need exists for a method and an apparatus which accurately and efficiently detects when a polishing system polishes a semiconductor device down to a polishing endpoint layer.

SUMMARY OF THE INVENTION

In accordance with one embodiment of the present invention, there is provided a method of planarizing a semiconductor wafer having a polishing endpoint layer that includes a ligand. One step of the method includes polishing a first side of the wafer in order to remove the ligand from the wafer. Another step of the method includes determining that a chelating agent has bound the ligand due to the polishing step removing the ligand of the polishing endpoint layer. The method also includes the step of terminating the polishing step in response to determining that the chelating agent has bound the ligand.

Pursuant to another embodiment of the present invention, there is provided a method of planarizing a semiconductor wafer down to a predetermined distance from a semiconductor substrate of the wafer. One step of the method includes forming in the wafer a ligand that is at the predetermined distance from the substrate of the wafer. Another step of the method includes polishing a first side of the wafer in order to remove the ligand from the wafer. The method also includes the step of determining that a chelating agent has bound the ligand due to the polishing step removing the ligand from the wafer. Moreover, the method includes the step of terminating the polishing step in response to determining that the chelating agent has bound the ligand.

Pursuant to yet another embodiment of the present invention, there is provided an apparatus for polishing a semiconductor wafer down to a ligand of the wafer. The apparatus includes a polishing platen having a polishing surface, a wafer carrier, a slurry supply system, and a polishing endpoint detector. The wafer carrier is configured to (i) engage the wafer by the second side of the wafer and (ii) press the first side of the wafer against the polishing surface of the polishing platen. The slurry supply system is configured to apply a chemical slurry to the first side of the wafer which (i) facilities removal of the ligand from the wafer, and (ii) receives the ligand removed from the wafer carrier. The polishing platen and the wafer carrier are configured to rub the first side of the wafer against the polishing surface in the presence of the chemical slurry in order to remove the ligand from the wafer. The polishing endpoint detector is operable to detect whether a chelating agent has bound the ligand due to the polishing platen removing the ligand from the wafer. Moreover, the polishing endpoint detector is operable to cause the polishing of the wafer to terminate in response to detecting that the chelating agent has bound the ligand.

It is an object of the present invention to provide an improved method and apparatus for determining an endpoint of a polishing process.

It is an object of the present invention to provide a new and useful method and apparatus for determining an endpoint of a polishing process.

It is also an object of the present invention to provide a method and apparatus which accurately and efficiently detect when a polishing system polishes a semiconductor device down to a polishing endpoint layer.

It is a further object of the present invention to provide a method and apparatus for determining that a polishing system has polished a device down to a polishing endpoint without removing the device from the polishing system.

The above and other objects, features, and advantages of the present invention will become apparent from the following description and the attached drawings.

DETAILED DESCRIPTION OF A PREFERRED EMBODIMENT

Figure 1A:
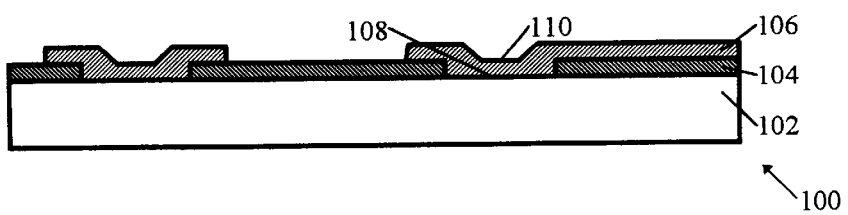
FIGS. 1A–1F show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

As stated above, a semiconductor wafer after various steps of a fabrication process needs to be planarized in order to remove rough topography from the surface of the semiconductor wafer. FIGS. 1A–1F illustrate sectional views of a semiconductor wafer 100 after various steps of a fabrication process of the present invention. In particular, FIGS. 1A–1F illustrate planarization of a semiconductor 100 down to a polishing endpoint layer 118.

FIG. 1A shows the semiconductor wafer 100 after a number of fabrication steps. As shown, the semiconductor wafer 100 includes a semiconductor substrate 102 upon which a fabrication process formed a first insulating layer 104 and a first metal layer 106. In particular, the fabrication process formed the first insulating layer 104 upon the semiconductor substrate 102, and a contact hole 108 in the first insulating layer 104 at a location above a transistor portion (not shown) of the semiconductor substrate 102. Moreover, the fabrication process patterned the first metal layer 106 (e.g. aluminum) over the first insulating layer 104 and the contact hole 108. As a result, the first metal layer 106 fills the contact hole 108 forming an electrical contact with the transistor portion of the semiconductor substrate 102. Moreover, the filling of the contact hole 108 forms a pit 110 in the portion of the first metal layer 106 lying above the contact hole 108.

Figure 1B:
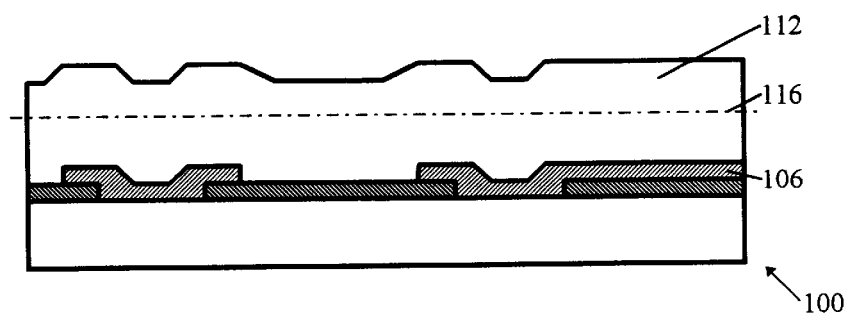

The semiconductor wafer 100 is shown in FIG. 1B after the fabrication process formed a second insulating layer 112 upon the surface of the semiconductor wafer 100. As shown in FIG. 1B, the second insulating layer 112 has a highly uneven surface topography. The uneven surface topography of the second insulating layer 112 would cause accuracy problems in fabricating additional layers of the semiconductor wafer 100. For example, the uneven surface topography would cause control problems for a lithography process used to pattern a second metal layer 120 (FIG. 1F) upon the second insulating layer 112. In order to avoid the accuracy problems associated with the uneven topography of the second insulating layer 112, a polishing system such as the polishing system 210 of FIG. 2 polishes the second insulating layer 112 down to a first level 116, thus planarizing the surface of the second insulating layer 112.

Figure 1C:
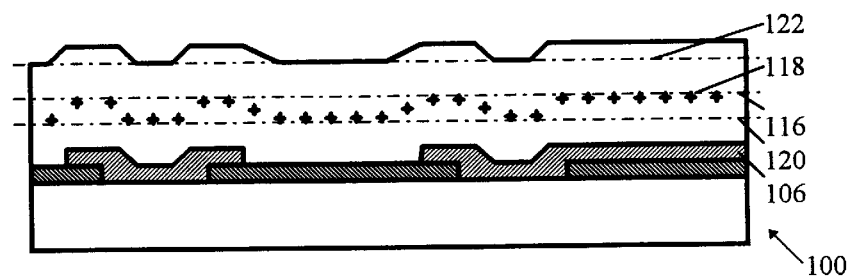
Figure 2:
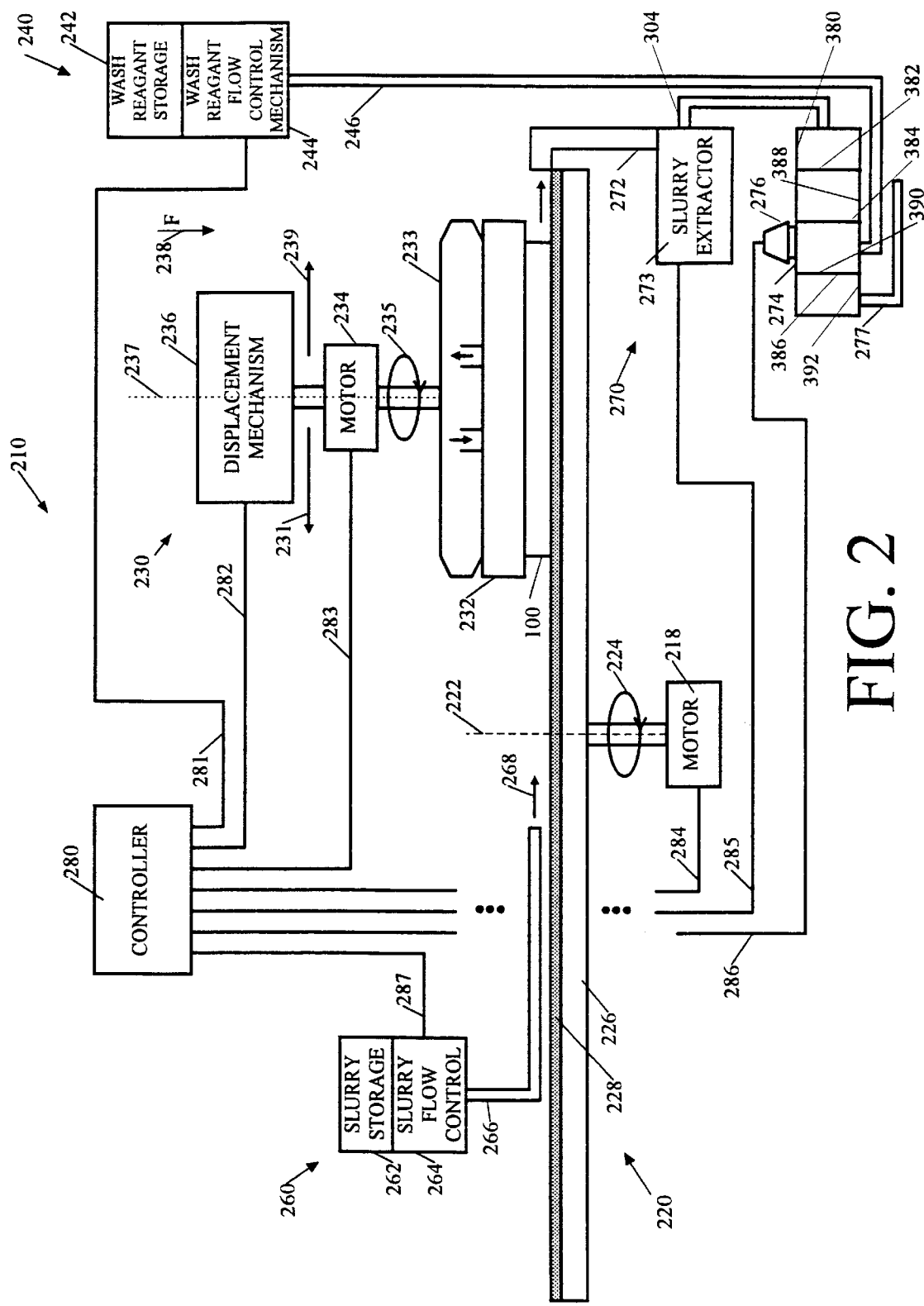
FIG. 2 shows an embodiment of a polishing system which incorporates various features of the present invention therein.

In order to enable the polishing system 210 of FIG. 2 to accurately determine when the first level 116 is reached, the fabrication process implants a polishing endpoint layer 118 into the second insulating layer 112. As will be discussed in more detail below, the polishing endpoint layer 118 in the present invention includes a chelation ligand, such as platinum ions, which the polishing system 210 uses in determining a polishing endpoint. As shown in FIG. 1C, the implanted polishing endpoint layer 118 starts at the first level 116 and ends at a second level 120 that lies above the first metal layer 106. Methods of ion implanting material into a semiconductor wafer are well known in the art. Accordingly, ion implantation techniques are not described herein.

However, it should be appreciated by those skilled in the art, that implantation techniques distribute the implanted material (e.g. platinum ions) at various depths from the surface of implantation with a peak distribution occurring at the desired depth. Accordingly, implantation techniques implant some material at a depth greater than the desired depth, and implant some material at a depth less than the desired depth. Since implantation of the material into underlying layers may result in reliability problems, the implantation technique should ensure that the underlying layers such as the first metal layer 106 are not contaminated with the implanted material. Furthermore, since the polishing system 210 utilizes the implanted material of the polishing endpoint layer 118 to determine the polishing endpoint, the implantation technique should implant the material of the polishing endpoint layer 118 such that the polishing endpoint layer 118 starts below a second level 122 that corresponds to the lowest part of the surface to be planarized.

The implantation technique also tends to create a nonplanar polishing endpoint layer 118 due to the uneven surface topography of the second insulating layer 112. Since the implantation technique implants the material of the polishing endpoint layer 118 through the surface of the second insulating layer 112, the implanted polishing endpoint layer 118 generally follows the topography of the second insulating layer 112. As a result, the implantation technique needs to account for the uneven topography of the second insulating layer 112 when determining the desired depth of the implanted polishing endpoint layer 118. In some cases it may be desirable to polish the surface of the semiconductor wafer 100 prior to implanting the polishing endpoint layer 118 in order to lessen variations in the surface topography of the second insulating layer 112. Polishing the second insulating layer 112 prior to implanting the polishing endpoint layer 118 generally generates a more planar polishing endpoint layer 118, thus making it easier to implant a polishing endpoint layer 118 which is (i) deep enough to cause the polishing system 210 to planarize the semiconductor wafer 100, and (ii) not deep enough to cause the implantation technique to contaminate underlying layers with implanted material.

Figure 1D:
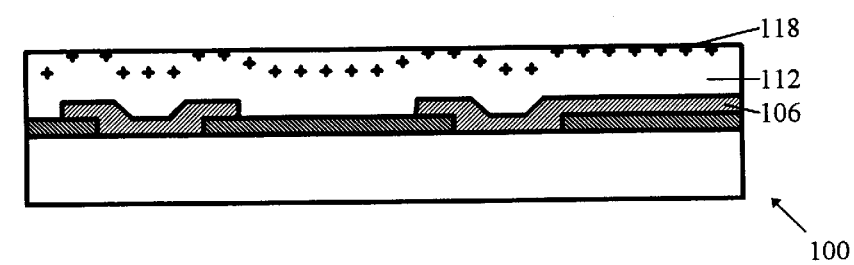
Figure 1E:
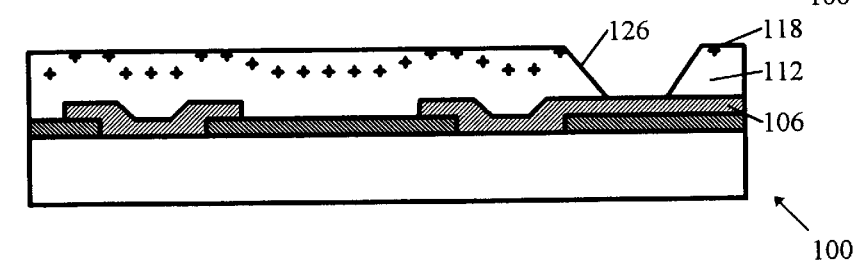
Figure 1F:
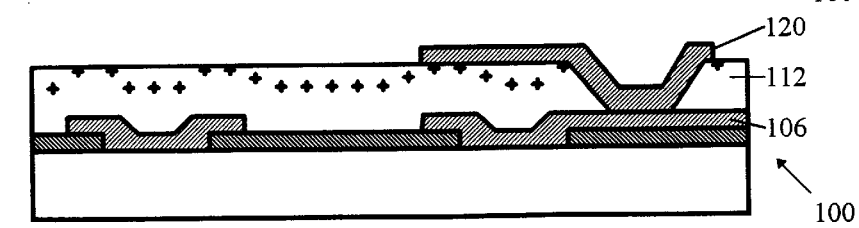

FIG. 1D shows the semiconductor wafer 100 after the polishing system 210 has polished the semiconductor wafer 100 down to the polishing endpoint layer 118. As depicted, the semiconductor wafer 100 has a planar surface upon which additional layers may be fabricated. For example, the fabrication process may etch a via 126 through the second insulating layer 112 and the polishing endpoint layer 118 (FIG. 1E). Then, the fabrication process may pattern a second metal layer 120 upon the second insulating layer 112 and the polishing endpoint layer 118 as shown in FIG. 1F. It should be appreciated that depending upon (i) the nature of the additional layer that the fabrication process is to form upon the planarized surface of the semiconductor wafer 100 and (ii) the material of the implanted polishing endpoint layer 118, the fabrication process may need to form a third insulating layer upon the planarized surface prior to forming the additional layer in order to insulate the additional layer from the polishing endpoint layer 118.

Referring now to FIG. 2, there is shown a preferred embodiment of a polishing system 210 which planarizes a front side or surface of a semiconductor wafer or device. To this end, the polishing system 210 includes a platen motor or other drive mechanism 218 and platen subassembly 220. The platen motor 218 rotates the platen subassembly 220 about a center axis 222 at a platen velocity $V_P$. The platen motor 218 may rotate the platen subassembly 220 in a clockwise direction as shown by arrow 224 or in the counterclockwise direction.

The platen subassembly 220 includes a polishing platen 226 and polishing pad 228 mounted upon the polishing platen 226. Both the polishing platen 226 and the polishing pad 228 are preferably circular and define a polishing surface against which the polishing system 210 may polish the semiconductor wafer 100. Moreover, the polishing pad 228 is typically made of blown polyurethane which protects the polishing platen 226 from chemical slurry and other chemicals introduced during the polishing process.

The polishing system 210 also includes a polishing head subassembly 230. The polishing head subassembly 230 includes a wafer carrier 232, a cooling mechanism 233, a carrier motor or other drive mechanism 234, and a wafer carrier displacement mechanism 236. The wafer carrier 232 applies a controlled adjustable downward force F (as illustrated by arrow 238) to press semiconductor wafer 100 into polishing pad 228 to facilitate polishing of the front side of the semiconductor wafer 100. The carrier motor 234 rotates wafer carrier 232 and semiconductor wafer 100 about a center axis 237 at a wafer velocity $V_W$. The carrier wafer may rotate the wafer carrier 232 in a clockwise direction as shown by arrow 235 or in the counterclockwise direction. However, the carrier motor 234 preferably rotates the wafer carrier 232 in the same rotational direction as platen motor 218 rotates the platen subassembly 220 (although the carrier motor 234 may rotate the semiconductor wafer 100 in the rotational direction opposite the rotational direction of the platen subassembly 220 as desired).

The wafer carrier 232 also includes mechanisms (not shown) for holding the semiconductor wafer 100. For example, the wafer carrier 232 may include a vacuum-type mechanism which generates a vacuum force that draws the semiconductor wafer 100 against the wafer carrier 232. Once the semiconductor wafer 100 is positioned on the wafer carrier 232 and held in contact with the platen subassembly 220 for polishing, the vacuum force may be removed. In such an arrangement, the wafer carrier 232 may be designed with a friction surface or a carrier pad which engages the back side of the semiconductor wafer 100. Furthermore, the carrier pad and downward force F create a frictional force between the wafer carrier 232 and the semiconductor wafer 100 that effectively holds the semiconductor wafer 100 against the wafer carrier 232 and causes the semiconductor wafer 100 to rotate at the same velocity as the wafer carrier 232. Such wafer carriers and carrier pads are of conventional design and are commercially available.

Moreover, the cooling mechanism 233 counteracts heat generated during the polishing process in order to maintain the wafer carrier 232 at a substantially constant temperature. In particular, the cooling mechanism neutralizes the heat generated due to (i) friction and (ii) the chemical slurry reacting with the front side of the semiconductor wafer 100.

The displacement mechanism 236 moves the wafer carrier 232 and the semiconductor wafer 100 under a controlled force F across the platen subassembly 220 as indicated by arrows 231 and 239. The semiconductor wafer 100 is moved at an adjustable rate and along a variable polishing path P. The polishing path P may be linear, sinusoidal, or a variety of other patterns. The wafer carrier displacement mechanism 236 is also capable of moving the semiconductor wafer 100 along a polishing path to a location beyond the edge of the polishing pad 228 so that the semiconductor wafer 100 "overhangs" the edge. This overhang arrangement permits the semiconductor wafer 100 to be moved partially on and partially off the polishing pad 228 to compensate for polishing irregularities caused by a relative velocity differential between the faster moving outer portions and the slower moving inner portions of the platen subassembly 220.

The polishing system 210 also includes a wash system 240 and a chemical supply system 260. The wash system 240 includes a wash reagent storage 242, a wash reagent flow control mechanism 244, and a wash reagent conduit 246. The wash reagent storage 242 includes one or more containers for storing wash reagents. In particular, the wash reagent storage 242 stores wash reagents which cause a chelating agent to disassociate with a ligand such as the metal ions implanted into the polishing endpoint layer 118. Illustratively, the wash reagent storage 242 may store ethanol ($CH_3CH_2OH$) which causes a chelating agent to disassociate with platinum ions of the polishing endpoint layer 118.

However, it should be appreciated that the above wash reagent is merely exemplary and that many other wash reagents may be suitable for use with the polishing system 210. For example, ethanol may be replaced with other wash reagents (e.g. other alcohols) as long as (i) the alternative wash reagent causes the chelating agent to disassociate with the ligand and (ii) the chelating agent and the ligand are soluble in the alternative wash reagent.

The wash reagent flow control mechanism 244 controls the flow of the wash reagent through the wash reagent conduit 246, and the wash reagent conduit 246 connects the wash system 240 to a chelating chamber 390 of testing area 274 (discussed below) so that a wash reagent may be transferred from the wash system 240 to chelating chamber 390 of testing area 274.

The slurry supply system 260 includes a slurry storage 262, a slurry flow control mechanism 264, and a slurry conduit 266. The reagent storage 262 includes one or more containers for storing slurry. In a preferred embodiment, the slurry storage 262 stores (i) a slurry that includes alumina (i.e. $AlO_3$) which is an abrasive material that facilitates polishing of the front side of the semiconductor wafer 100 and (ii) reactants which selectively react to certain materials of the front side of the semiconductor wafer 100. Chemical slurries having such properties are well known and commercially available. Moreover, in the preferred embodiment the slurry stored in the slurry storage 262 is sufficiently acidic to dissolve the platinum ions of the polishing endpoint layer 118.

The slurry flow control mechanism 264 controls the flow of slurry through the slurry conduit 266, and the slurry conduit 266 transfers the slurry from the slurry storage 262 to the polishing area atop platen subassembly 220. To this end, the slurry flow control mechanism 264 and the slurry conduit 266 introduce slurry as indicated by arrow 268 atop the polishing pad 228 at a slurry flow rate The polishing system 210 further includes an endpoint detector assembly 270. The endpoint detector assembly 270 includes an extraction conduit 272, an extraction flow control mechanism 273, a testing area 274, a sensor 276, and a waste conduit 277. Testing area 274 includes a number of filters. Specifically testing area 274 includes an initial filter 382, a secondary filter 384, and a chelating filter 386. Initial filter 382, secondary filter 384, and chelating filter 386 divide testing area 274 into an initial filtration chamber 380, a secondary filtration chamber 388, a chelating chamber 390, and a terminal chamber 392. The extraction conduit 272 receives effluent from the polishing area atop platen subassembly 220. The effluent may include the chemical slurry of the slurry supply system 260, and materials removed from the semiconductor wafer 100. The extraction flow control mechanism 273 controls the flow of effluent from the extraction conduit 272 to the initial filtration chamber 380 of testing area 274. To this end, the extraction flow control mechanism 273 and the extraction conduit 272 introduce effluent to the initial filtration chamber 380 at an extraction rate $\Phi_E$. Moreover, the extraction flow control mechanism 273 includes a pre-filter (not shown) which filters the alumina particles out of the effluent prior to the effluent entering initial filtration chamber 380. In addition, the pre-filter removes any relatively large particles of various unknown solids from the effluent.

The waste conduit 277 of the endpoint detector 270 connects the terminal chamber 392 to a waste treatment facility (not shown). The waste conduit 277 transfers the effluent at a waste flow rate $\Phi_W$ from the testing area 274 to a waste treatment facility that treats and properly disposes of the effluent.

The sensor 276 is preferably an optical sensor, such as a spectrophotometer, operable to analyze the spectral characteristics of the effluent present in the chelating chamber 390 and generate an endpoint detection signal when the effluent has a particular spectral characteristic that is indicative of the polishing endpoint being reached. To this end, the sensor 276 is operable to determine whether a chelating agent present in chelating chamber 390 has formed a complex (i.e. chelated) with the ligand (i.e. platinum ions) of polishing endpoint layer 118. For example, 5-[p-(dimethylamino) benzylidene]rhodanine, which has the following formula:

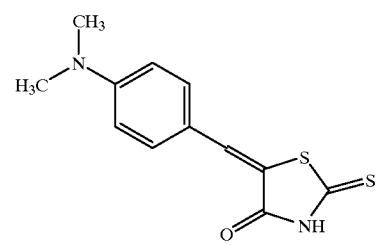

can be utilized as the chelating agent in the present invention. For instance, a 0.2% 5-[p-(dimethylamino) benzylidene]rhodanine solution (weight/volume) can be prepared in 0.1% nitric acid (volume/volume), and this chelating solution used to fill chelating chamber 390. It should be appreciated that 5-[p-(dimethylamino) benzylidene]rhodanine prepared in the above described manner will chelate platinum ions, and the formation of the 5-[p-(dimethylamino)benzylidene]rhodanine:platinum ion complex causes a color change in the solution contained within chelating chamber 390. In particular, formation of the 5-[p-(dimethylamino)benzylidene]rhodanine:platinum ion complex causes the solution to change from a substantially clear solution to a solution having a dark brown color.

However, it should be understood that chelating agents and ligands other than 5-[p-(dimethylamino)benzylidene] rhodanine and platinum ions, respectively, are contemplated as long as the alternative chelating agent and ligand cause a spectral change, e.g. a color change, in the solution contained within chelating chamber 390 when the chelating agent:ligand complex is formed. For example, with respect to the chelating agent 5-[p-(dimethylamino)benzylidene] rhodanine, metal ions other than platinum ions can serve as the ligand of polishing endpoint layer 118. In particular, silver, mercury, copper, gold, and palladium ions can be used as the ligand of polishing endpoint layer 118. It should also be understood that sensor 276 can also be a spectrophotometer operable to analyze spectral characteristics which are not within the visible spectrum. For example, the sensor 276 can be operable to analyze the ultraviolet or infrared spectral characteristics of a solution containing a chelating agent and a ligand.

The sensor 276 is operable to detect the above described color change in the solution contained within chelating chamber 390. Accordingly, the sensor 276 of endpoint detector 270 monitors the spectral characteristics of the solution contained within chelating chamber 390 and generates an endpoint detection signal in response to detecting that the spectral characteristics (e.g. the color) of the solution has changed in a predetermined manner.

The polishing system 210 further includes a controller 280 for controlling the polishing system 210 in order to effectuate the desired polishing results for the semiconductor wafer 100. The controller 280 is operatively coupled to the components of the polishing system 210 via connectors 281–287 in order to monitor and control in real-time the components of the polishing system 210. In particular, the controller 280 is configured to control the advancement of the wash reagent into chelating chamber 390, the slurry flow rate $\Phi_S$, the extraction rate $\Phi_E$, the polishing path P, the wafer velocity $V_W$, and the platen velocity $V_P$. The controller 280 may be implemented with a microcontroller, an ASIC, discrete circuit components, or any combination of the above. Furthermore, the controller 280 may include computational means for calculating specific parameters and memory for storing software routines and parameters.

More specifically, the controller 280 is coupled to the wash reagent flow control mechanism 244 via a connector 281 to control the advancement of the wash reagent into chelating chamber 390. The controller 280 is coupled to the displacement mechanism 236 via connector 282 to monitor and controllably adjust the polishing path P of the semiconductor wafer 100 and the speed at which the semiconductor wafer 100 is moved across the platen subassembly 220. The controller 280 is coupled to the carrier motor 234 via connector 283 to monitor the motor rpm and wafer velocity $V_W$ imparted by the wafer carrier 232 and to adjust the speed of the wafer carrier 232 as desired. The controller 280 is coupled to platen motor 218 via connector 284 to monitor the motor rpm and platen velocity $V_P$ of platen subassembly 220, and to adjust the speed of the platen subassembly 220 as desired. The controller 280 is coupled to the extraction flow control mechanism 273 via a connector 285 to monitor and adjust the flow rate $\Phi_E$ of the effluent. The controller 280 is coupled to the sensor 276 of the endpoint detection system 270 via a connector 286 to monitor the endpoint detection signal generated by the endpoint detection device 270. The controller 280 is coupled to the slurry flow control mechanism 264 via a connector 287 to monitor and adjust the slurry flow rate $\Phi_S$.

Prior to operating the polishing system 210, a fabrication process forms in the semiconductor wafer 100 a polishing endpoint layer 118 that includes a chelation ligand (e.g. platinum ions). In particular, the fabrication process forms the polishing endpoint layer 118 at a predetermined distance from the surface of the semiconductor wafer 100, the substrate 102, or another layer of the semiconductor wafer 100. (Note that the aforementioned predetermined distance can take into account any "braking distance tolerance" required by polishing system 210, e.g. any finite amount of polishing which takes place after the endpoint signal (discussed below) has been generated.) Then, the wafer carrier 232 engages the back side of the semiconductor wafer 100 and presses the front side of the semiconductor wafer 100 against the polishing pad 228 with a force F. The controller 280 causes (i) the platen motor 218 to rotate the platen subassembly 220 at a platen velocity $V_P$, (ii) the carrier motor 234 to rotate the wafer carrier 232 at a wafer velocity of $V_W$, (iii) the displacement mechanism 236 to execute a polishing path P, and (iv) the slurry flow control mechanism 264 to apply chemical slurry to the polishing pad 228 at a slurry flow rate $\Phi_S$. The resulting complex movement of the wafer carrier 232 relative to the polishing pad 228, the force F, and the chemical slurry all cooperate to remove material, including the ligand, from the front side of the semiconductor wafer 100.

Once the polishing system 210 is close to the polishing endpoint layer 118, the controller 280 causes the extraction flow control mechanism 273 to extract effluent from the polishing pad 228 at an extraction rate $\Phi_E$ Extraction flow control mechanism 273 then advances the effluent into initial chamber 380 via conduit 304. It should be understood that the effluent is advanced into initial chamber 380 under enough pressure so that the effluent is force through initial filter 382. The size of the pores defined in initial filter 382 are such that any small particles which escaped filtration by the pre-filter are trapped on initial filter 382. Preferably, initial filter 382 is a 5 micron teflon filter available from the Millipore Corporation located in Bedford, Mass. After passing through initial filter 382, the effluent enters secondary filtration chamber 388 and is forced through secondary filter 384. The size of the pores defined in secondary filter 384 are such that relatively smaller particles which escaped filtration by the pre-filter and initial filter 382 are trapped on secondary filter 384. Preferably, secondary filter 384 is a 1 micron teflon filter which can be obtained from the Millipore Corporation located in Bedford, Mass. After passing through secondary filter 384, the effluent enters chelating chamber 390. Once in chelating chamber 390, the effluent is mixed with the chelating solution that contains 5-[p-(dimethylamino)benzylidene]rhodanine. It should be appreciated that if platinum ions of the polishing endpoint layer 118 are present in the effluent that enters chelating chamber 390, the above discussed 5-[p-(dimethylamino)benzylidene] rhodanine:platinum ion complex is formed. Forming the 5-[p-(dimethylamino)benzylidene]rhodanine:platinum ion complex causes the effluent contained within chelating chamber 390 to change from a substantially clear solution to a solution having a dark brown color. The endpoint detector 270 then generates an endpoint signal once the endpoint detector 270 detects the aforementioned change in the spectral characteristic of the effluent has occurred. In response to the endpoint detector 270 generating the endpoint signal, the controller 280 terminates the polishing of the semiconductor wafer 100 since the semiconductor wafer 100 has a planar surface with an even topography when the polishing system 210 polishes the semiconductor wafer 100 down to the polishing endpoint layer 118.

Figure 3:
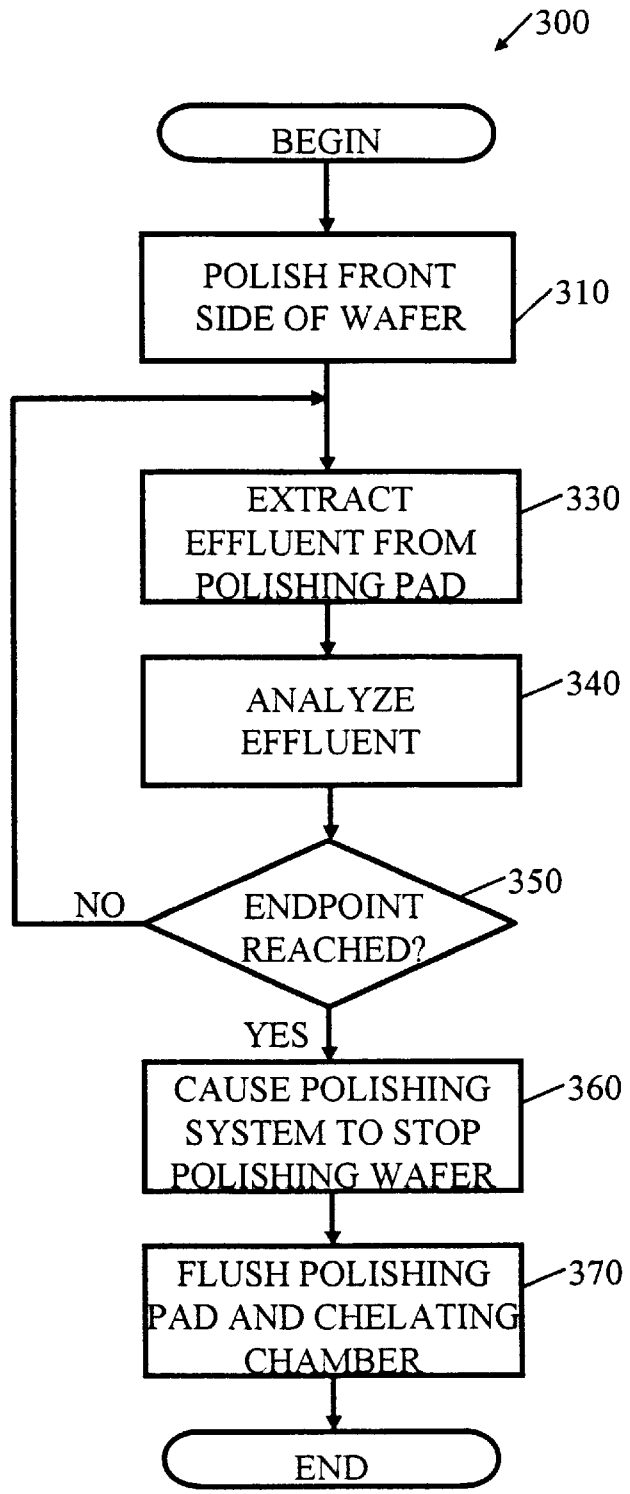
FIG. 3 shows a flowchart of a polishing procedure used by the polishing system of FIG. 2.

FIG. 3 illustrates a polishing procedure 300 utilized by polishing system 210. The controller 280 in step 310 of the polishing procedure 300 causes the polishing system 210 to begin polishing the front side of the semiconductor wafer 100 in order to remove material from the front side of the semiconductor wafer 100. To this end, the controller 280 causes the wafer carrier 232 to rub the front side of the semiconductor wafer 100 against the platen subassembly 220. Moreover, the controller 280 causes the chemical slurry supply system 260 to apply chemical slurry atop platen subassembly in order to facilitate the removal of material from the front side of the semiconductor wafer 100.

After a predetermined amount of polishing time has elapsed, the controller in step 330 causes the extraction flow control 273 of the endpoint detector 270 to introduce effluent extracted from the platen subassembly 220 into the initial filtration chamber 380 via conduit 304. The predetermined amount of polishing time is close to but less than the amount of polishing time required for the polishing system 210 to reach the polishing endpoint layer 118. The endpoint detector 270 then analyzes in step 340 the effluent in order to determine whether the 5-[p-(dimethylamino)benzylidene] rhodanine:platinum ion complex has been formed.

Since in the preferred embodiment the chelating agent 5-[p-(dimethylamino)benzylidene]rhodanine reacts with metal ions, in particular platinum ions, to produce a spectral characteristic change in the effluent present in the chelating chamber 390, the sensor 276 of the preferred embodiment in step 350 determines whether the effluent in chelating chamber 390 changes from a substantially clear solution to a solution have a dark brown color. If sensor 276 determines that the spectral characteristic has occurred, then the sensor 276 transmits an endpoint signal to the controller 280;

otherwise, the polishing system 210 returns to step 330 to extract more effluent.

In response to receiving the endpoint signal, the controller 280 in step 360 causes the polishing system 210 to stop polishing the semiconductor wafer 100. It should be appreciated that the controller 280 may allow the polishing system 210 to continue polishing the semiconductor wafer 100 for a predetermined amount of time in order to further remove material from the semiconductor wafer 100. This further removal of material or overpolishing may be desirable after certain steps of a fabrication process.

The controller 280 then in step 370 flushes the platinum ions from the polishing platen 220. In particular, the controller 280 causes the chemical slurry to be applied to the polishing platen 220 for a predetermined period of time. The continual application of the chemical slurry after the polishing system 210 has stopped polishing the semiconductor wafer 100 helps flush the platinum ions of the polishing endpoint layer 118 from the platen subassembly 220 so that the endpoint detector 270 may detect the endpoint of the next semiconductor wafer to be polished.

In addition, in step 370, the controller 280 causes the wash reagent flow control mechanism 244 to advance a volume of the wash reagent to chelating chamber 390 via wash reagent conduit 246. Advancing a volume of the wash reagent into chelating chamber 390 causes (i) 5-[p-(dimethylamino) benzylidene]rhodanine to disassociate with the platinum ions of the polishing endpoint layer 118 and (ii) the platinum ions to be washed out of chelating chamber 390. Specifically, substantially all of the platinum ions are advanced through the pores defined in chelating filter 386 and into terminal chamber 392. Once located in terminal chamber 392, the platinum ions are advanced to the waste treatment facility via waste conduit 277. However, it should be understood that the pores defined in chelating filter 386 are of the size such that the chelating agent, i.e. 5-[p-(dimethylamino)benzylidene]rhodanine, is substantially prevented from passing through chelating filter 386. On the other hand, as discussed above, the pores defined in chelating filter 386 are large enough such that particles which are smaller than the chelating agent (e.g. a chelating ligand such as platinum ions) can pass through chelating filter 386 and thus be removed from chelating chamber 390. Preferably, chelating filter 386 has a pore size up to 10 nanometers. It should be noted that The Center for Micro-Engineered Materials at the University of New Mexico located in Albuquerque, N. Mex. fabricates various filters similar to chelating filter 386. Thus, a chelating filter suitable for use as chelating filter 386 may be obtained upon request from The Center for Micro-Engineered Materials. Therefore, it should be appreciated that the chelating agent substantially remains within chelating chamber 390, secondary filtration chamber 388, and initial filtration chamber 380. Note however that the chelating agent primarily remains in chelating chamber 390. It should also appreciated that causing the platinum ions to disassociate from the chelating agent results in the solution in chelating chamber 390 turning from a dark brown color back to a substantially clear solution. Once the platinum ions have disassociated from the chelating agent, and the solution in chelating chamber 390 has turned back to a substantially clear solution, the above described polishing process can be repeated with another semiconductor wafer 100.

It should be appreciated that, as a result of using a chelating agent, only a small amount of ligand (e.g. platinum ions) from the polishing endpoint layer 118 is required to cause a significant spectral change in the solution contained in chelating chamber 390. Therefore, utilizing a chelating agent which causes a significant spectral change of a solution when in the presence of a small amount of ligand effectively amplifies the presence of the ligand. This amplification results in a detection system that can utilize a relatively inexpensive spectrophotometer type detector to indirectly detect the presence of very small amounts of ligand (e.g. platinum). This is in contrast to other polishing arrangements which utilize detection methods which attempt to directly detect material removed from the polishing endpoint layer 118. These polishing arrangements must utilize relatively expensive detectors which increases the cost of manufacturing semiconductor wafers.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected. For example, while the polishing endpoint layer 118 has been described as being implanted into the semiconductor wafer 100, other methods of forming the polishing endpoint layer 118 may also be used. For example, U.S. Pat. No. 5,668,063 to Fry et al., the disclosure which is hereby incorporated by reference, discloses forming a tracer layer upon other layers. This method of forming a tracer layer may be suitable for forming the polishing endpoint layer 118 used by the polishing system 210 of the present invention.

What is claimed is:

1. A method of planarizing a semiconductor wafer having a polishing endpoint layer that includes a ligand of a chelating agent, comprising the steps of:

polishing a first side of said wafer in order to remove said ligand from said wafer;

determining that said chelating agent has bound said ligand due to said polishing step removing said ligand of said polishing endpoint layer; and terminating said polishing step in response to determining that said chelating agent has bound said ligand.

2. The method of claim 1, further comprising the step of:

forming said polishing endpoint layer at a distance from a substrate of said wafer.

3. The method of claim 1, further comprising the step of:

implanting said polishing endpoint layer through said first side of said wafer at a distance from said first side of said wafer.

4. The method of claim 1, wherein:

said polishing step includes the step of applying a slurry to said first side of said wafer, said slurry receiving said ligand removed from said wafer, and said determining step includes the step of analyzing said slurry to determine whether said chelating agent has bound said ligand due to said polishing step removing said ligand of said polishing endpoint layer.

5. The method of claim 1, wherein:

said polishing step includes the step of applying a slurry to said first side of said wafer, said slurry receiving said ligand removed from said wafer, and said determining step includes the step of detecting a color change of a solution which includes said chelating agent and said ligand.

6. The method of claim 5, wherein:

said polishing step includes the step of applying a slurry to said first side of said wafer, said slurry receiving said ligand removed from said wafer, and said determining step includes the step of filtering said slurry prior to detecting said color change of said solution which includes said chelating agent and said ligand.

7. The method of claim 1, wherein:

said polishing step includes the step of applying a slurry to said first side of said wafer, said slurry receiving said ligand removed from said wafer, and said determining step includes the step of utilizing a spectrophotometer to determine whether said chelating agent has bound said ligand.

8. A method of planarizing a semiconductor wafer down to a distance from a semiconductor substrate of said wafer, comprising the steps of:

forming in said wafer a ligand that is at said distance from said substrate of said wafer;

polishing a first side of said wafer in order to remove said ligand from said wafer;

determining that a chelating agent had bound said ligand due to said polishing step removing said ligand of said polishing endpoint layer; and terminating said polishing step in response to determining that said chelating agent has bound said ligand.

9. The method of claim 8, wherein said forming step comprises the step of:

implanting said ligand through said first side of said wafer in order to form said ligand in said wafer at said distance from said substrate.

10. The method of claim 8, wherein:

said polishing step includes the step of applying a slurry to said first side of said wafer, said slurry receiving said ligand removed from said wafer, and said determining step includes the step of analyzing said slurry to determine whether said chelating agent has bound said ligand due to said polishing step removing said ligand of said polishing endpoint layer.

11. The method of claim 8, wherein:

said polishing step includes the step of applying a slurry to said first side of said wafer, said slurry receiving said ligand removed from said wafer, and said determining step includes the step of detecting a color change of a solution which includes said chelating agent and said ligand.

12. The method of claim 11, wherein:

said polishing step includes the step of applying a slurry to said first side of said wafer, said slurry receiving said material removed from said wafer, and said determining step includes the step of filtering said slurry prior to detecting said color change of said solution which includes said chelating agent and said ligand.

13. The method of claim 8, wherein:

said polishing step includes the step of applying a slurry to said first side of said wafer, said slurry receiving said material removed from said wafer, and said determining step includes the step of utilizing a spectrophotometer to determine whether said chelating agent has bound said ligand.

* * * * *